(12) United States Patent
Jung et al.

(10) Patent No.: US 9,741,876 B2
(45) Date of Patent: *Aug. 22, 2017

(54) COMPOSITION FOR SOLAR CELL ELECTRODES AND ELECTRODE FABRICATED USING THE SAME

(71) Applicant: SAMSUNG SDI CO., LTD., Yongin-si, Gyeonggi-do (KR)

(72) Inventors: Seok Hyun Jung, Suwon-si (KR); Young Ki Park, Suwon-si (KR); Dong Suk Kim, Suwon-si (KR); Ju Hee Kim, Suwon-si (KR); Min Su Park, Suwon-si (KR); Koon Ho Kim, Suwon-si (KR); Min Jae Kim, Suwon-si (KR); Seak Cheol Kim, Suwon-si (KR); Sang Hyun Yang, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 178 days.

This patent is subject to a terminal disclaimer.

(21) Appl. No.: 14/692,185

(22) Filed: Apr. 21, 2015

(65) Prior Publication Data

US 2015/0228818 A1    Aug. 13, 2015

Related U.S. Application Data

(63) Continuation of application No. 14/534,370, filed on Nov. 6, 2014, now Pat. No. 9,039,937.

(30) Foreign Application Priority Data

Dec. 17, 2013  (KR) .................. 10-2013-0157659
Sep. 18, 2014  (KR) .................. 10-2014-0124652

(51) Int. Cl.
*H01B 1/16*  (2006.01)
*H01B 1/22*  (2006.01)
(Continued)

(52) U.S. Cl.
CPC ...... *H01L 31/022425* (2013.01); *C03C 3/122* (2013.01); *C03C 4/14* (2013.01);
(Continued)

(58) Field of Classification Search
CPC .... H01B 1/00; H01B 1/16; H01B 1/22; C03C 8/18; C03C 14/006; C03C 2201/00;
(Continued)

(56) References Cited

U.S. PATENT DOCUMENTS 7,537,713 B2   5/2009   Satou et al.
8,652,873 B1   2/2014   Hang et al.
(Continued)

FOREIGN PATENT DOCUMENTS

KR   10-2011-0003149 A   1/2011
TW          I406300 B    8/2013
(Continued)

OTHER PUBLICATIONS

Taiwanese Office Action dated Jun. 10, 2015.
(Continued)

*Primary Examiner* — Mark Kopec
(74) *Attorney, Agent, or Firm* — Lee & Morse, P.C.

(57) ABSTRACT

A composition for solar cell electrodes includes a silver powder; a glass frit; and an organic vehicle, wherein the glass frit includes bismuth (Bi), tellurium (Te), and chromium (Cr).

11 Claims, 1 Drawing Sheet

(51) Int. Cl.
| | |
|---|---|
| *H01L 35/00* | (2006.01) |
| *C09D 5/24* | (2006.01) |
| *H01L 31/0224* | (2006.01) |
| *C03C 4/14* | (2006.01) |
| *C03C 3/12* | (2006.01) |
| *C03C 8/04* | (2006.01) |
| *C03C 8/18* | (2006.01) |
| *H05K 1/09* | (2006.01) |

(52) U.S. Cl.
CPC .............. *C03C 8/04* (2013.01); *C03C 8/18* (2013.01); *C09D 5/24* (2013.01); *H01B 1/22* (2013.01); *H01L 31/0224* (2013.01); *H05K 1/092* (2013.01); *Y02E 10/50* (2013.01)

(58) Field of Classification Search
CPC ........ C09D 5/24; H05K 1/0296; H05K 1/092; H01L 35/0224; H01L 35/14
See application file for complete search history.

(56) References Cited

U.S. PATENT DOCUMENTS

| | | | |
|---|---|---|---|
| 8,889,980 B2 | 11/2014 | Carroll et al. | |
| 8,968,607 B2* | 3/2015 | Choi | H01B 1/22 |
| | | | 136/252 |
| 9,023,254 B2* | 5/2015 | Hang | H01B 1/22 |
| | | | 136/256 |
| 9,039,937 B1* | 5/2015 | Jung | C09D 5/24 |
| | | | 252/500 |
| 2013/0037761 A1 | 2/2013 | Hang et al. | |
| 2014/0131629 A1 | 5/2014 | Choi et al. | |
| 2016/0284891 A1* | 9/2016 | Jung | H01B 1/16 |

FOREIGN PATENT DOCUMENTS

| | | |
|---|---|---|
| TW | I432539 B | 4/2014 |
| WO | WO 2012/135551 A1 | 10/2012 |

OTHER PUBLICATIONS

"Order Granting Request for *Ex Parte* Reexamination" mailed Sep. 3, 2015, in Control No. 90/013,548 (corresponding to U.S. Pat. No. 9,039,937).

Office Action mailed Dec. 17, 2015 in corresponding co-pending ex parte reexamination 90/013,548.

Amendment and corresponding Rule 132 Declaration and English translations of priority documents filed Feb. 16, 2016, in *ex parte* reexamination of Control No. 90/013,548 (U.S. Pat. No. 9,039,937).

Interview summary mailed Feb. 17, 2016, in *ex parte* reexamination of Control No. 90/013,548 (U.S. Pat. No. 9,039,937).

Office Action dated Jan. 24, 2017 in the corresponding Korean Patent Application No. 2014-0124652. (No English language translation provided).

\* cited by examiner

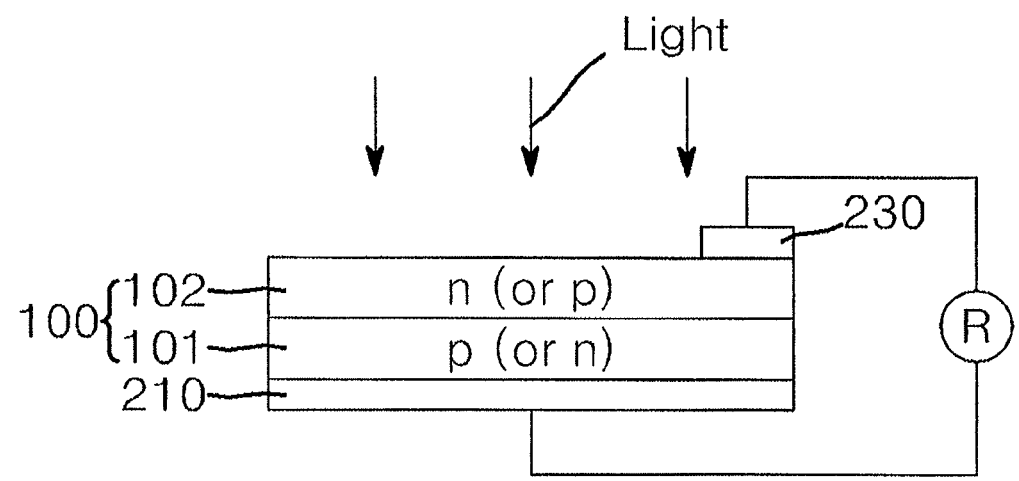

COMPOSITION FOR SOLAR CELL ELECTRODES AND ELECTRODE FABRICATED USING THE SAME

CROSS-REFERENCE TO RELATED APPLICATIONS

This is a continuation application based on application Ser. No. 14/534,370, filed Nov. 6, 2014, now U.S. Pat. No. 9,039,937, the entire contents of which is hereby incorporated by reference.

Korean Patent Application Nos. 10-2013-0157659, filed on Dec. 17, 2013, and 10-2014-0124652, filed on Sep. 18, 2014, in the Korean Intellectual Property Office, and entitled: "Composition for Solar Cell Electrodes and Electrode Fabricated Using the Same," are incorporated by reference herein in their entirety.

BACKGROUND

1. Field

Embodiments relate to a composition for solar cell electrodes and electrodes fabricated using the same.

2. Description of the Related Art

Solar cells generate electric energy using the photovoltaic effect of a p-n junction which converts photons of sunlight into electricity. In the solar cell, front and rear electrodes are formed on upper and lower surfaces of a semiconductor wafer or substrate with the p-n junction, respectively. Then, the photovoltaic effect of the p-n junction is induced by sunlight entering the semiconductor wafer and electrons generated by the photovoltaic effect of the p-n junction provide electric current to the outside through the electrodes.

SUMMARY

Embodiments are directed to a composition for solar cell electrodes including
a silver powder, a glass frit, and an organic vehicle. The glass frit includes bismuth (Bi), tellurium (Te), and chromium (Cr).

A mole ratio of chromium to tellurium may range from about 1:1 to about 1:80.

The glass frit may further include at least one element selected from lead (Pb), lithium (Li), zinc (Zn), tungsten (W), phosphorus (P), silicon (Si), magnesium (Mg), cesium (Ce), strontium (Sr), molybdenum (Mo), titanium (Ti), tin (Sn), indium (In), vanadium (V), barium (Ba), nickel (Ni), copper (Cu), sodium (Na), potassium (K), antimony (Sb), germanium (Ge), gallium (Ga), calcium (Ca), arsenic (As), cobalt (Co), zirconium (Zr), manganese (Mn), aluminum (Al), and boron (B).

The glass frit may include about 5 mol % to about 50 mol % of lead (Pb) based on a total weight of the glass frit.

The glass frit may be prepared from a mixture of metal oxides including about 5 wt % to about 30 wt % of bismuth oxide, about 40 wt % to about 80 wt % of tellurium oxide, about 1 wt % to about 15 wt % of chromium oxide, and about 1 wt % to about 50 wt % of a fourth metal oxide.

The fourth metal oxide may include at least one metal oxide selected from lead (Pb), lithium (Li), zinc (Zn), tungsten (W), phosphorus (P), silicon (Si), magnesium (Mg), cesium (Ce), strontium (Sr), molybdenum (Mo), titanium (Ti), tin (Sn), indium (In), vanadium (V), barium (Ba), nickel (Ni), copper (Cu), sodium (Na), potassium (K), antimony (Sb), germanium (Ge), gallium (Ga), calcium (Ca), arsenic (As), cobalt (Co), zirconium (Zr), manganese (Mn), aluminum (Al), and boron (B) oxides.

The fourth metal oxide may include about 1 wt % to about 10 wt % of lithium oxide, about 1 wt % to about 10 wt % of zinc oxide, and about 1 wt % to about 10 wt % of tungsten oxide based on the total weight of the mixture of metal oxides.

The fourth metal oxide may include about 15 wt % to about 50 wt % of lead oxide (PbO) based on a total weight of the mixture of metal oxides.

The composition may include about 60 wt % to about 95 wt % of the silver powder, about 0.5 wt % to about 20 wt % of the glass frit, and about 1 wt % to about 30 wt % of the organic vehicle.

The glass frit may have an average particle diameter (D50) of about 0.1 µm to about 10 µm.

The composition may further include at least one additive selected from a dispersant, a thixotropic agent, a plasticizer, a viscosity stabilizer, an anti-foaming agent, a pigment, a UV stabilizer, an antioxidant, and a coupling agent.

The organic vehicle may include a binder resin, the binder resin having a weight average molecular weight (Mw) of about 30,000 g/mol to about 200,000 g/mol.

The composition may have a viscosity of about 100,000 cps to about 500,000 cps.

Embodiments are also directed to a solar cell electrode fabricated using the composition for solar cell electrodes as described above.

BRIEF DESCRIPTION OF THE DRAWING

Features will become apparent to those of skill in the art by describing in detail exemplary embodiments with reference to the attached drawing in which:

The FIGURE illustrates a schematic view of a solar cell in accordance with one embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figure, the dimensions of layers and regions may be exaggerated for clarity of illustration. It will also be understood that when a layer or element is referred to as being "on" another layer or substrate, it can be directly on the other layer or substrate, or intervening layers may also be present.

Composition for Solar Cell Electrodes

A composition for solar cell electrodes according to embodiments may include a silver powder, a glass frit including bismuth (Bi), tellurium (Te), and chromium (Cr), for example, elemental bismuth (Bi), tellurium (Te), and chromium (Cr), and an organic vehicle.

(A) Silver Powder

The composition for solar cell electrodes according to embodiments may include a silver (Ag) powder as a conductive powder. The particle size of the silver powder may be nanometer or micrometer scale. For example, the silver powder may have a particle size of dozens to several hundred nanometers, or several to dozens of micrometers. In other implementations, the silver powder may be a mixture of two or more types of silver powders having different particle sizes.

The silver powder may have a spherical, flake or amorphous shape. In one implementation, the silver powder may have an average particle diameter (D50) of about 0.1 μm to about 10 μm, for example about 0.5 μm to about 5 μm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range of average particle diameter, the composition may provide low contact resistance and low line resistance.

The silver powder may be present in an amount of about 60 wt % to about 95 wt % based on the total weight of the composition. Within this range, the conductive powder may prevent deterioration in conversion efficiency due to an increase in resistance. For example, the conductive powder may be present in an amount of about 70 wt % to about 90 wt %. In some embodiments, the silver powder may be present in an amount of about 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt % based on the total weight of the composition.

(B) Glass Frit Including Bismuth (Bi), Tellurium (Te), and Chromium (Cr)

The glass frit may serve to enhance adhesion between the conductive powder and the wafer or the substrate and to form silver crystal grains in an emitter region by etching an anti-reflection layer and melting the silver powder so as to reduce contact resistance during a baking process of the electrode paste. Further, during the sintering process, the glass frit may be softened and may decrease the baking temperature.

When the area of the solar cell is increased in order to improve solar cell efficiency, there is a possibility that contact resistance of the solar cell may be increased. Thus, it is desirable to minimize the influence on the p-n junction while minimizing serial resistance (Rs) and maximizing open circuit voltage (Voc). In addition, the baking temperature may vary within a broad range with increasing use of various wafers having different sheet resistances. It is desirable that the glass frit secure sufficient thermal stability to withstand a wide range of baking temperatures.

Solar cells may be connected to each other by a ribbon to constitute a solar cell battery. In this case, there is a possibility that low adhesive strength between solar cell electrodes and the ribbon may cause detachment of the cells or deterioration in reliability.

According to embodiments, in order to ensure that the solar cell has desirable electrical and physical properties such as conversion efficiency and adhesive strength, a glass frit including bismuth (Bi), tellurium (Te), and chromium (Cr) is used.

In an implementation, a mole ratio of chromium (Cr) to tellurium (Te) may range from about 1:1 to about 1:80. Within this range, solar cell electrodes fabricated using the glass frit may exhibit excellent adhesive strength with respect to a ribbon and excellent conversion efficiency, while securing low serial resistance and contact resistance. In some embodiments, a mole ratio of chromium to tellurium may range from about 1:1 to about 1:40, for example, about 1:5 to about 1:35.

In some embodiments, in addition to bismuth (Bi), tellurium (Te), and chromium (Cr), the glass frit may further include at least one element selected from lead (Pb), lithium (Li), zinc (Zn), tungsten (W), phosphorus (P), silicon (Si), magnesium (Mg), cesium (Ce), strontium (Sr), molybdenum (Mo), titanium (Ti), tin (Sn), indium (In), vanadium (V), barium (Ba), nickel (Ni), copper (Cu), sodium (Na), potassium (K), antimony (Sb), germanium (Ge), gallium (Ga), calcium (Ca), arsenic (As), cobalt (Co), zirconium (Zr), manganese (Mn), aluminum (Al), and boron (B).

In particular, in addition to bismuth (Bi), tellurium (Te), and chromium (Cr), the glass frit may further include about 5 mol % to about 50 mol % of lead (Pb), for example, elemental lead (Pb), based on the total weight of the glass frit. The glass frit may provide excellent effects in terms of processability (process window). In some embodiments, lead (Pb) may be present in an amount of about 5 mol %, 6 mol %, 7 mol %, 8 mol %, 9 mol %, 10 mol %, 11 mol %, 12 mol %, 13 mol %, 14 mol %, 15 mol %, 16 mol %, 17 mol %, 18 mol %, 19 mol %, 20 mol %, 21 mol %, 22 mol %, 23 mol %, 24 mol %, 25 mol %, 26 mol %, 27 mol %, 28 mol %, 29 mol %, 30 mol %, 31 mol %, 32 mol %, 33 mol %, 34 mol %, 35 mol %, 36 mol %, 37 mol %, 38 mol %, 39 mol %, 40 mol %, 41 mol %, 42 mol %, 43 mol %, 44 mol %, 45 mol %, 46 mol %, 47 mol %, 48 mol %, 49 mol %, or 50 mol % based on the total weight of the glass frit.

The glass fit may be prepared from a mixture of metal oxides including bismuth oxide, tellurium oxide, chromium oxide, and a fourth metal oxide.

In some embodiments, the fourth metal oxide may include at least one metal oxide selected from lead (Pb), lithium (Li), zinc (Zn), tungsten (W), phosphorus (P), silicon (Si), magnesium (Mg), cesium (Ce), strontium (Sr), molybdenum (Mo), titanium (Ti), tin (Sn), indium (In), vanadium (V), barium (Ba), nickel (Ni), copper (Cu), sodium (Na), potassium (K), antimony (Sb), germanium (Ge), gallium (Ga), calcium (Ca), arsenic (As), cobalt (Co), zirconium (Zr), manganese (Mn), aluminum (Al), and boron (B) oxides.

In one embodiment, the mixture of metal oxides may include about 5 wt % to about 30 wt % of bismuth oxide; about 40 wt % to about 80 wt % of tellurium oxide; about 1 wt % to about 15 wt % of chromium oxide; and about 1 wt % to about 50 wt % of the fourth metal oxide. Within this range, the glass frit may secure both excellent adhesive strength and excellent conversion efficiency.

In some embodiments, the fourth metal oxide may include about 15 wt % to about 50 wt % of lead oxide (PbO) based on the total weight of the mixture of metal oxides. Within this range, the glass frit may provide excellent effects in terms of processability (process window). In some embodiments, lead oxide may be present in an amount of about 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, or 50 wt %.

In some embodiments, the fourth metal oxide may include lithium oxide ($Li_2O$), zinc oxide (ZnO), and tungsten oxide ($WO_3$). For example, the fourth metal oxide may include 1 wt % to 10 wt % of lithium oxide, 1 wt % to 10 wt % of zinc oxide, and 1 wt % to 10 wt % of tungsten oxide based on the total weight of the mixture of metal oxides. Within this range, the glass frit can secure both excellent adhesive strength and excellent conversion efficiency.

In some embodiments, wherein the glass frit may be prepared from a mixture of metal oxides including 5 wt % to 30 wt % of bismuth oxide; 40 wt % to 80 wt % of tellurium oxide; 1 wt % to 15 wt % of chromium oxide; and 1 wt % to 10 wt % of lithium oxide, 1 wt % to 10 wt % of zinc oxide, and 1 wt % to 10 wt % of tungsten oxide. Within this range, the glass frit can secure both excellent adhesive strength and excellent conversion efficiency.

The glass fit may be prepared from such metal oxides by any suitable method. For example, the metal oxides may be mixed in a predetermined ratio. Mixing may be carried out using a ball mill or a planetary mill. The mixed composition may be melted at about 900° C. to about 1300° C., followed by quenching to about 25° C. The obtained resultant may be subjected to pulverization using a disc mill, a planetary mill, or the like, thereby providing a glass frit.

In some embodiments, the glass frit may have an average particle diameter D50 of about 0.1 μm to about 10 μm. The glass frit may have a spherical or amorphous shape.

In some embodiments, the glass frit may be present in an amount of about 0.5 wt % to about 20 wt % based on the total amount of the composition. Within this range, the glass frit may secure excellent adhesive strength and excellent conversion efficiency given varying surface resistances while minimizing serial resistance so as to improve solar cell efficiency. In some embodiments, the glass frit may be present in an amount of about 0.5 wt %, 1 wt %, 1.5 wt %, 2 wt %, 2.5 wt %, 3 wt %, 3.5 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %.

(C) Organic Vehicle

The organic vehicle may impart suitable viscosity and rheological characteristics for printing to the paste composition through mechanical mixing with the inorganic component of the composition for solar cell electrodes.

The organic vehicle may be any suitable organic vehicle used for the composition for solar cell electrodes. For example, the organic vehicle may include a binder resin, a solvent, or the like.

The binder resin may be selected from acrylate resins or cellulose resins. Ethyl cellulose may be used as the binder resin. In other implementations, the binder resin may be selected from among ethyl hydroxyethylcellulose, nitrocellulose, a mixture of ethylcellulose and phenol resins, alkyd, phenol, acrylate ester, xylene, polybutene, polyester, urea, melamine, vinyl acetate resins, wood rosin, polymethacrylates of alcohols, or the like.

In some embodiments, the binder resin may have a weight average molecular weight (Mw) of about 30,000 g/mol to about 200,000 g/mol. Within this range, the binder resin may provide excellent effects in terms of printability. By way of example, the binder resin may have a weight average molecular weight of about 40,000 g/mol to about 150,000 g/mol.

The solvent may be selected from the group of, for example, hexane, toluene, ethyl cellosolve, cyclohexanone, butyl cellosolve, butyl carbitol(diethylene glycol monobutyl ether), dibutyl carbitol(diethylene glycol dibutyl ether), butyl carbitol acetate(diethylene glycol monobutyl ether acetate), propylene glycol monomethyl ether, hexylene glycol, terpineol, methylethylketone, benzylalcohol, γ-butyrolactone, ethyl lactate, and combinations thereof.

The organic vehicle may be present in an amount of about 1 wt % to about 30 wt % based on the total weight of the composition. Within this range, the organic vehicle may provide sufficient adhesive strength and excellent printability to the composition. In some embodiments, the organic vehicle may be present in an amount of about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt % based on the total weight of the composition.

(D) Additives

The composition may further include typical additives, as needed, to enhance flow properties, process properties, and stability. The additives may include dispersants, thixotropic agents, plasticizers, viscosity stabilizers, anti-foaming agents, pigments, UV stabilizers, antioxidants, coupling agents, or the like. These additives may be used alone or as mixtures thereof.

These additives may be present in an amount of about 0.1 wt % to about 5 wt % in the composition. This amount may be changed as desired. In some embodiments, the additives may be present in an amount of about 0.1 wt %, 0.2 wt %, 0.3 wt %, 0.4 wt %, 0.5 wt %, 0.6 wt %, 0.7 wt %, 0.8 wt %, 0.9 wt %, 1 wt %, 1.5 wt %, 2 wt %, 2.5 wt %, 3 wt %, 3.5 wt %, 4 wt %, 4.5 wt %, or 5 wt %.

In addition, the composition for solar cell electrodes may have a viscosity of about 100,000 cps to about 500,000 cps (about 100 kcps to about 500 kcps). Within this range, the composition may provide excellent effects in terms of printability. By way of example, the composition may have a viscosity of about 250,000 cps to about 400,000 cps (about 250 kcps to about 400 kcps).

Solar Cell Electrode and Solar Cell Including the Same

Embodiments are also directed to an electrode formed of the composition for solar cell electrodes and a solar cell including the same. FIG. 1 illustrates a solar cell in accordance with one embodiment.

Referring to FIG. 1, a rear electrode 210 and a front electrode 230 may be formed by printing and baking the composition on a wafer or substrate 100 that includes a p-layer (or n-layer) 101 and an n-layer (or p-layer) 102, which will serve as an emitter. For example, a preliminary process for preparing the rear electrode 210 is performed by printing the composition on the rear surface of the wafer 100 and drying the printed composition at about 200° C. to about 400° C. for about 10 seconds to about 60 seconds. Further, a preliminary process for preparing the front electrode may be performed by printing the paste on the front surface of the wafer and drying the printed composition. Then, the front electrode 230 and the rear electrode 210 may be formed by baking the wafer at about 400° C. to about 950° C., for example at about 850° C. to about 950° C., for about 30 seconds to about 50 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

Bismuth oxide, tellurium oxide, and chromium oxide were mixed together with lithium oxide, zinc oxide and tungsten oxide as the fourth metal oxide according to the composition listed in Table 1 and subjected to melting and sintering at 900° C. to 1,400° C., thereby preparing a glass frit having an average particle diameter (D50) of 2.0 μm.

As an organic binder, 0.8 wt % of ethylcellulose (STD4, Dow Chemical Company)(Mw=50,000 g/mol) was sufficiently dissolved in 8.5 wt % of butyl carbitol at 60° C. 86.5 wt % of a spherical silver powder (AG-4-8, Dowa Hightech Co. Ltd.) having an average particle diameter of 2.0 μm, 3.5 wt % of the prepared glass frit, 0.2 wt % of a dispersant BYK102 (BYK-chemie) and 0.5 wt % of a thixotropic agent Thixatrol ST (Elementis Co., Ltd.) were added to the binder solution, followed by mixing and kneading in a 3-roll kneader, thereby preparing a composition for a solar cell electrodes.

The viscosity of the prepared composition was measured at room temperature using a rotary viscometer HBDV-II+ Pro (Brookfield Co., Ltd.). In measurement of the viscometer, a sample cup was completely filled with a sample and spindle #14 was mounted on the viscometer. Then, the viscosity was measured at a shear rate of 10 rpm after stabilizing the temperature for 5 minutes. The obtained result is shown in Table 2.

The prepared composition was deposited over a front surface of a crystalline mono-wafer by screen-printing in a predetermined pattern, followed by drying in an IR drying furnace to prepare a front electrode. Then, the composition for electrodes containing aluminum was printed on a rear side of the wafer and dried in the same manner. Cells formed according to this procedure were subjected to baking at 980° C. for 40 seconds in a belt-type baking furnace, and evaluated as to serial resistance Rs (Ω), fill factor FF (%), and conversion efficiency (%) using a solar cell efficiency tester CT-801 (Pasan Co., Ltd.). Then, flux was applied to the front electrode of the cells and bonded to a ribbon at 300° C. to 400° C. using a soldering iron (Hakko Co., Ltd.). Then, the resultant was evaluated as to adhesive strength (N/mm) at a peeling angle of 180° and a stretching rate of 50 mm/min using a tensioner (Tinius Olsen). The measured conversion efficiency, serial resistance, and adhesive strength (N/mm) are shown in Table 2.

Examples 2 to 20 and Comparative Examples 1 to 3

Compositions for solar cell electrodes were prepared and evaluated as to physical properties in the same manner as in Example 1 except that the glass frits were prepared in compositions as listed in Table 1. Results are shown in Table 2.

TABLE 1

| | Composition of glass frit (unit: wt %) | | | | | | | |
|---|---|---|---|---|---|---|---|---|
| | $Bi_2O_3$ | $TeO_2$ | $Cr_2O_3$ | $Li_2O$ | $Na_2CO_3$ | ZnO | PbO | $WO_3$ |
| Example 1 | 9.0 | 76.0 | 1.0 | 6.0 | — | 7.0 | — | 1.0 |
| Example 2 | 11.5 | 70.5 | 4.0 | 5.0 | 1.0 | 8.0 | — | — |
| Example 3 | 5.0 | 66.0 | 15.0 | 7.0 | — | 5.0 | — | 2.0 |
| Example 4 | 23.7 | 49.8 | 12.5 | 4.0 | 2.0 | 5.0 | — | 3.0 |
| Example 5 | 16.5 | 67.5 | 2.0 | 4.0 | 1.0 | 8.0 | — | 1.0 |
| Example 6 | 30.0 | 41.0 | 15.0 | 9.0 | — | 5.0 | — | — |
| Example 7 | 11.2 | 62.3 | 12.5 | 1.0 | 3.0 | 9.0 | — | 1.0 |
| Example 8 | 23.7 | 54.8 | 7.5 | 8.0 | 2.0 | 4.0 | — | — |
| Example 9 | 5.0 | 76.0 | 5.0 | 2.0 | 2.0 | 8.0 | — | 2.0 |
| Example 10 | 14.0 | 69.0 | 3.0 | 7.0 | — | 7.0 | — | — |
| Example 11 | 30.0 | 51.0 | 5.0 | 2.0 | 1.0 | 7.0 | — | 4.0 |
| Example 12 | 11.2 | 67.3 | 7.5 | 4.0 | 2.0 | 5.0 | — | 3.0 |
| Example 13 | 9.0 | 72.0 | 5.0 | 9.0 | — | 3.0 | — | 2.0 |
| Example 14 | 19.0 | 62.0 | 5.0 | 8.0 | 2.0 | 4.0 | — | — |
| Example 15 | 19.0 | 66.0 | 1.0 | 7.0 | 1.0 | 5.0 | — | 1.0 |
| Example 16 | 11.5 | 72.5 | 2.0 | 6.0 | 1.0 | 6.0 | — | 1.0 |
| Example 17 | 17.5 | 58.5 | 10.0 | 7.0 | 2.0 | 4.0 | — | 1.0 |
| Example 18 | 16.5 | 65.5 | 4.0 | 6.0 | — | 7.0 | — | 1.0 |
| Example 19 | 9.0 | 66.5 | 1.0 | 1.0 | — | 7.0 | 14.5 | 1.0 |
| Example 20 | 5.0 | 41.0 | 1.0 | 0.8 | — | 2.0 | 50.2 | — |
| Comparative Example 1 | 8.0 | 70.0 | — | 6.0 | 1.0 | 8.0 | — | 7.0 |
| Comparative Example 2 | 10.0 | 86.0 | — | 3.0 | — | 1.0 | — | — |
| Comparative Example 3 | 11.0 | 73.5 | — | 5.0 | 1.0 | 7.0 | — | 2.5 |

TABLE 2

| | Viscosity (kcps) | Serial Resistance (mΩ) | Fill Factor | Efficiency (%) | Adhesive Strength (N/mm) | Mole ratio (Te/Cr) |
|---|---|---|---|---|---|---|
| Example 1 | 312 | 2.64 | 77.22 | 16.77 | 5.7 | 36.188 |
| Example 2 | 351 | 2.69 | 77.04 | 16.72 | 5.0 | 8.392 |
| Example 3 | 321 | 2.92 | 76.83 | 16.65 | 6.0 | 2.095 |
| Example 4 | 333 | 2.95 | 76.75 | 16.63 | 4.6 | 1.895 |
| Example 5 | 315 | 2.70 | 76.99 | 16.70 | 4.0 | 16.070 |
| Example 6 | 324 | 2.89 | 76.89 | 16.67 | 4.7 | 1.302 |
| Example 7 | 322 | 2.93 | 76.76 | 16.63 | 4.6 | 2.371 |
| Example 8 | 346 | 2.85 | 76.90 | 16.67 | 4.7 | 3.476 |
| Example 9 | 327 | 2.70 | 76.99 | 16.70 | 5.6 | 7.238 |
| Example 10 | 328 | 2.31 | 77.31 | 16.80 | 4.9 | 10.952 |
| Example 11 | 330 | 2.76 | 76.96 | 16.69 | 5.6 | 4.857 |
| Example 12 | 325 | 2.76 | 76.96 | 16.69 | 4.0 | 4.270 |
| Example 13 | 319 | 2.67 | 77.10 | 16.74 | 4.9 | 6.857 |
| Example 14 | 315 | 2.71 | 76.99 | 16.70 | 4.9 | 5.904 |
| Example 15 | 327 | 2.55 | 77.28 | 16.79 | 5.5 | 31.427 |
| Example 16 | 334 | 2.67 | 77.05 | 16.72 | 4.8 | 17.261 |
| Example | 341 | 2.81 | 76.94 | 16.68 | 4.5 | 2.786 |

TABLE 2-continued

| | Viscosity (kcps) | Serial Resistance (mΩ) | Fill Factor | Efficiency (%) | Adhesive Strength (N/mm) | Mole ratio (Te/Cr) |
|---|---|---|---|---|---|---|
| 17 | | | | | | |
| Example 18 | 325 | 2.70 | 77.00 | 16.71 | 5.4 | 7.797 |
| Example 19 | 334 | 2.95 | 77.00 | 16.71 | 5.2 | 31.665 |
| Example 20 | 328 | 2.64 | 76.90 | 16.67 | 4.9 | 19.523 |
| Comparative Example 1 | 324 | 3.00 | 71.54 | 15.05 | 3.3 | — |
| Comparative Example 2 | 350 | 3.22 | 72.06 | 15.28 | 3.3 | — |
| Comparative Example 3 | 336 | 3.03 | 71.45 | 14.93 | 2.7 | — |

It can be seen in Table 2, that the solar cell electrodes fabricated using the compositions prepared in Examples 1 to 20 exhibited considerably higher adhesive strength with respect to ribbons as well as lower serial resistance and excellent fill factor and conversion efficiency, as compared with those of Comparative Examples 1 to 3 wherein the compositions of the glass frits were not within the scope of embodiments.

By way of summation and review, The electrodes of the solar cell may be formed on a wafer by applying, patterning, and baking a composition for electrodes.

Continuous reduction in emitter thickness for improvement of solar cell efficiency may cause shunting, which can deteriorate solar cell performance. In addition, as the area of solar cells has gradually increased in area to achieve high efficiency, a risk of efficiency deterioration has increased due to increase in contact resistance of the solar cell.

Solar cells may be connected to each other by a ribbon to constitute a solar cell battery. In this case, low adhesion between electrodes and the ribbon may cause a large serial resistance and a deterioration in conversion efficiency. Moreover, electrodes fabricated using a composition for solar cell electrodes including conventional leaded glass frits may exhibit insufficient adhesive strength with respect to the ribbon.

As described above, a composition according to embodiments may exhibit excellent adhesive strength with respect to a ribbon connecting solar cells to each other and may minimize serial resistance (Rs), thereby providing excellent fill factor and conversion efficiency.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A composition for solar cell electrodes, comprising:
   a silver powder;
   an organic vehicle; and
   a glass fit that includes bismuth (Bi), tellurium (Te), and chromium (Cr), Te being the predominant metal in the glass frit in terms of wt % of the metal oxide
   wherein the glass frit includes lead oxide in an amount of 0 to 14.5 wt %.

2. The composition as claimed in claim 1, wherein the glass frit further includes at least one element selected from lithium (Li), zinc (Zn), tungsten (W), phosphorus (P), silicon (Si), magnesium (Mg), cesium (Ce), strontium (Sr), molybdenum (Mo), titanium (Ti), tin (Sn), indium (In), vanadium (V), barium (Ba), nickel (Ni), copper (Cu), sodium (Na), potassium (K), antimony (Sb), germanium (Ge), gallium (Ga), calcium (Ca), arsenic (As), cobalt (Co), zirconium (Zr), manganese (Mn), aluminum (Al), and boron (B).

3. The composition as claimed in claim 1, wherein the glass frit is prepared from a mixture of metal oxides including about 5 wt % to about 30 wt % of bismuth oxide, about 40 wt % to about 80 wt % of tellurium oxide, about 1 wt % to about 15 wt % of chromium oxide, and about 1 wt % to about 50 wt % of a fourth metal oxide.

4. The composition as claimed in claim 3, wherein the fourth metal oxide includes at least one metal oxide selected from lead (Pb), lithium (Li), zinc (Zn), tungsten (W), phosphorus (P), silicon (Si), magnesium (Mg), cesium (Ce), strontium (Sr), molybdenum (Mo), titanium (Ti), tin (Sn), indium (In), vanadium (V), barium (Ba), nickel (Ni), copper (Cu), sodium (Na), potassium (K), antimony (Sb), germanium (Ge), gallium (Ga), calcium (Ca), arsenic (As), cobalt (Co), zirconium (Zr), manganese (Mn), aluminum (Al), and boron (B) oxides.

5. The composition as claimed in claim 3, wherein the fourth metal oxide includes about 1 wt % to about 10 wt % of lithium oxide, about 1 wt % to about 10 wt % of zinc oxide, and about 1 wt % to about 10 wt % of tungsten oxide based on the total weight of the mixture of metal oxides.

6. The composition as claimed in claim 1, including:
   about 60 wt % to about 95 wt % of the silver powder;
   about 0.5 wt % to about 20 wt % of the glass frit; and
   about 1 wt % to about 30 wt % of the organic vehicle.

7. The composition as claimed in claim 1, wherein the glass fit has an average particle diameter (D50) of about 0.1 μm to about 10 μm.

8. The composition as claimed in claim 1, further comprising at least one additive selected from a dispersant, a thixotropic agent, a plasticizer, a viscosity stabilizer, an anti-foaming agent, a pigment, a UV stabilizer, an antioxidant, and a coupling agent.

9. The composition as claimed in claim 1, wherein the organic vehicle includes a binder resin, the binder resin having a weight average molecular weight (Mw) of about 30,000 g/mol to about 200,000 g/mol.

10. The composition as claimed in claim 1, wherein the composition has a viscosity of about 100,000 cps to about 500,000 cps.

11. A solar cell electrode fabricated using the composition for solar cell electrodes as claimed in claim 1.

* * * * *